United States Patent [19]
Zachrai

[11] Patent Number: 5,275,296
[45] Date of Patent: Jan. 4, 1994

[54] RACK FOR A CONTROL CABINET

[75] Inventor: Jürgen Zachrai, Dillenburg, Fed. Rep. of Germany

[73] Assignee: Rittal-Werk Rudolf Loh GmbH & Co. KG, Fed. Rep. of Germany

[21] Appl. No.: 990,881

[22] Filed: Dec. 11, 1992

[30] Foreign Application Priority Data

Dec. 12, 1991 [DE] Fed. Rep. of Germany ....... 4140956

[51] Int. Cl.⁵ ................................................ A47F 5/00
[52] U.S. Cl. ...................................... 211/26; 211/182; 211/189; 312/265.4
[58] Field of Search .................. 211/189, 191, 182, 26; 312/265.1, 265.4

[56] References Cited

U.S. PATENT DOCUMENTS

| | | |
|---|---|---|
| 3,075,818 | 1/1963 | Fay .................... 312/265.4 |
| 3,178,246 | 4/1965 | Riles . |
| 3,265,419 | 8/1966 | Durnbaugh et al. ........ 312/265.1 X |
| 4,093,078 | 6/1978 | Radek ................... 211/189 |
| 4,114,336 | 9/1978 | Bechet et al. ............. 312/265.1 X |
| 4,126,364 | 11/1978 | Reilly .................. 312/265.1 X |

FOREIGN PATENT DOCUMENTS

| | | |
|---|---|---|
| 3344598 | 9/1984 | Fed. Rep. of Germany . |
| 8814472 | 2/1989 | Fed. Rep. of Germany . |
| 3920353 | 12/1990 | Fed. Rep. of Germany . |

Primary Examiner—Robert W. Gibson, Jr.
Attorney, Agent, or Firm—Speckman, Pauley & Fejer

[57] ABSTRACT

A rack for a control cabinet comprising a plurality of frame pieces which are connected to each other in the area of the rack corners. A quickly and easily assembled rack with high torsional stiffness is created where the front horizontal and vertical frame pieces as well as the rear horizontal and vertical frame pieces are miter-cut on both ends and fixedly welded together to form a front and rear frame. The frame pieces used as depth braces are closed off on both ends by fastening plates provided with at least two fastening screw receptacles. Correspondingly distributed through-bores are cut in the corner areas of the frame. In each corner area of the frame, a cover plate is fastened on the frame by fastening screws. The fastening screws are inserted into fastening bores of the cover plates and screwed through the through-bores of the frame into the fastening screw receptacles of the fastening plates connected to the depth braces.

10 Claims, 1 Drawing Sheet

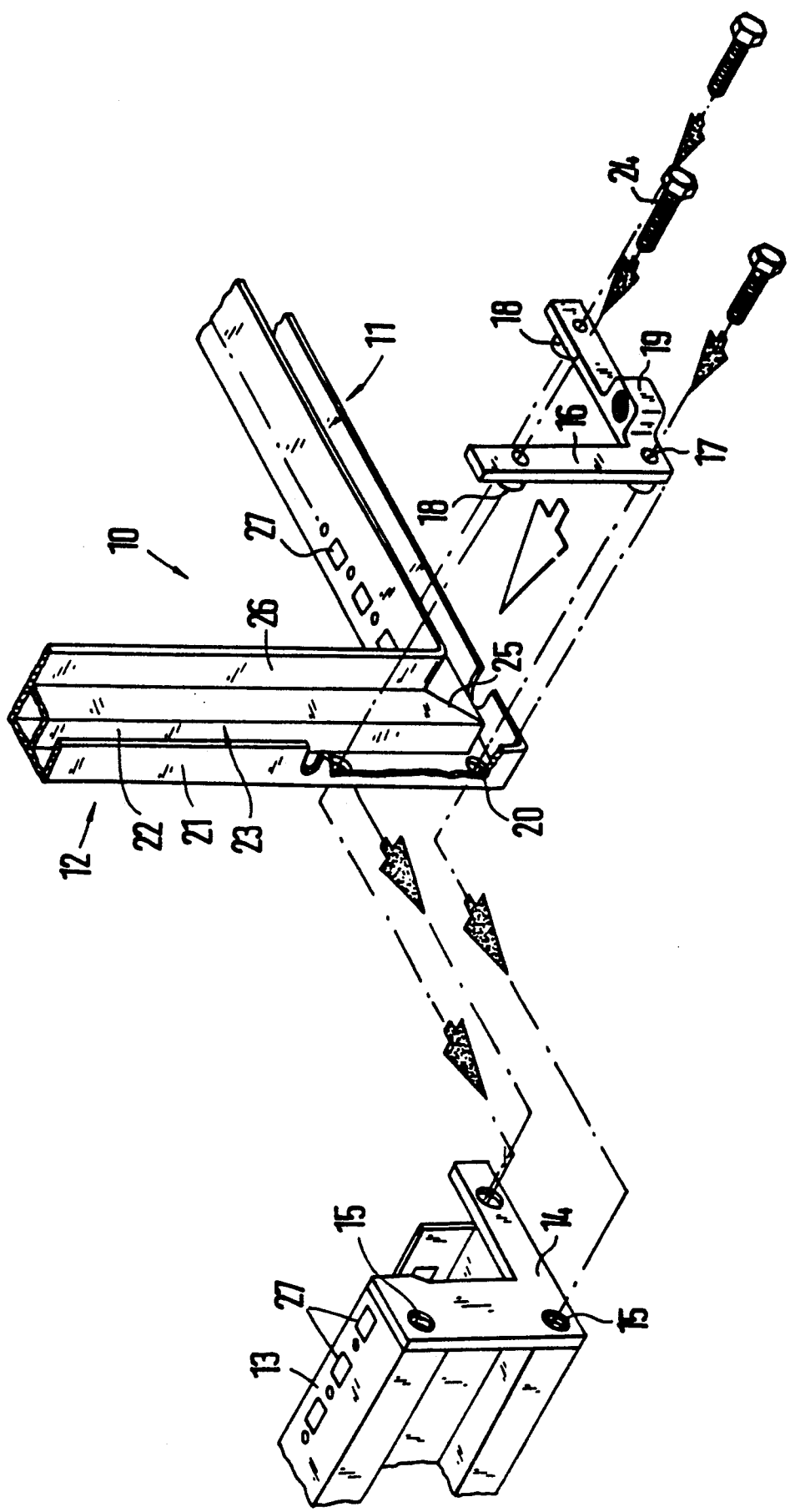

RACK FOR A CONTROL CABINET

BACKGROUND OF THE INVENTION

1. Field of the Invention

This invention relates to a rack for a control cabinet comprising twelve frame pieces which are connected to each other in the area of the corners of the cabinet.

2. Description of Prior Art

A rack of this type is taught by German Patent Publication DE 33 44 598 in which the frame pieces are provided with front faces which are aligned perpendicular to their longitudinal axes. The three frame pieces abutting on each other are connected in each corner area by a corner connection. In this case, the corner connector has three plug projections oriented perpendicular with respect to each other which are inserted into the inner receptacle of the hollow profile sections. The frame pieces in this case are bolted or welded to the corner connectors. In accordance with one embodiment, the rack and the wall elements and cabinet doors which are connected to the rack can be stored and transported disassembled. In accordance with a second embodiment, the control cabinet is completely assembled in the factory and is stored and delivered in this way.

When bolting the frame pieces to the corner connectors, the torsional stiffness of the rack leaves much to be desired. Furthermore, the expenditure for parts and assembly of the rack is considerable.

SUMMARY OF THE INVENTION

It is an object of this invention to provide a rack of the previously mentioned type which can be stored and delivered disassembled without increasing the expenditures for parts and assembly, and which has increased torsional stiffness in the assembled state.

This object is attained in accordance with one embodiment of the invention in which the front horizontal and vertical frame pieces as well as the rear horizontal and vertical frame pieces are miter-cut on both ends and fixedly welded together to form a front and rear frame. The frame pieces used as depth braces are closed off on both ends by fastening plates, which are provided with at least two fastening screw receptacles. Correspondingly distributed through-bores are cut in the corner areas of the frame. In each corner area of the frame, a cover plate is fastened on the frame by fastening screws. The fastening screws are inserted into fastening bores of the cover plates and are screwed through the through-bores of the frame into the fastening screw receptacles of the fastening plates connected to the depth braces.

The rack comprises two fixedly welded frames which are made into a complete, torsionally stiff rack with the help of the fastening plates on the depth braces and the cover plates. The assembly effort for putting the rack together is small. The corner connectors become particularly torsionally stiff, in accordance with a preferred embodiment of this invention, where the fastening plates and the cover plates are L-shaped and each has three fastening screw receptacles or fastening bores disposed on the corners of a right triangle.

Centering during production of the corner connectors is obtained in accordance with one embodiment of this invention where the fastening bores of the cover plates are guided through sleeve-like projections on the back of the cover plates facing the frame and the diameters of the through-bores in the frames are adapted to the exterior diameter of the sleeve-like projections of the cover plates. The height of the sleeve-like projections of the cover plates corresponds to the thickness of the frame pieces in the area of the through-bores or is slightly less, so that these projections on the cover plates do not interfere with the tightening of the screw connections.

In accordance with one embodiment of this invention, the frame pieces of the frames have L-shaped profiled legs formed on the outside, which form a frame-like receiving groove open toward the front or back of the rack. The L-shaped cover plates are matched in the width of their legs to the width of the receiving grooves. The cover plates with the fastening screws are optimally received in the receiving grooves of the frames.

For attaching wall elements, in particular cabinet doors, in accordance with one embodiment of this invention, bearing seats with a bearing bore or a bearing screw thread are formed on a portion of the cover plates on the front facing away from the frame.

BRIEF DESCRIPTION OF THE DRAWING

This invention will be better understood from the following detailed description in conjunction with the drawing wherein the single FIGURE shows an exploded view of a corner of the rack in accordance with one embodiment of this invention.

DESCRIPTION OF PREFERRED EMBODIMENTS

Only a corner of the rack in accordance with one embodiment of this invention is shown in the position of assembly in the drawing. The front, horizontal frame piece 11 and the vertical frame piece 12 are identical hollow profiled sections which have been miter-cut on front ends. As shown by the welding bead 25, the abutting frame pieces 11 and 12 are fixedly welded together. Two frames 10 are formed in this way which constitute the front and back of the rack.

Bridges 26 are formed on the hollow profiled sections, which form a frame-like sealing bridge towards the exterior. L-shaped profiled legs 21 on the circumferential outsides of the frame 10 form a receiving groove 23, which is open towards the front or the back of the rack. The two frames 10 are connected in the four corner areas by horizontal frame pieces 13 embodied as depth braces. For this purpose, the frame pieces 13 are closed off at both ends with L-shaped cover plates 14. The frame pieces 13 are embodied as stamped bent pieces and are provided, the same as the frame pieces 11 and 12, with two inner sides which are at right angles to each other, forming an inside edge, and which are provided with identical rows of fastening receivers 27. Three fastening screw receptacles 15 have been cut into the fastening plates 14 on the corners of a right triangle, that is, in the corner area and at the two leg ends of the fastening plate 14.

Through-bores 20 have been cut into the groove bottom of the receiving groove 23 of the frame pieces 11 and 12, corresponding to the distribution of the fastening screw receptacles 15. An L-shaped cover plate 16 is inserted into the receiving groove 23, namely in each corner area of the two frames 10. The width of the legs of the cover plate 16 is adapted to the width of the receiving groove 13 and the fastening bores 17 are flush with the through-bores 20 and with the fastening screw receptacles 15, so that the cover plate 16 can be screwed to the frame 10 with the fastening screws 24 and the frame 10 to the frame piece 13, which is used as a depth brace. On the back of the cover plate 16 facing the frame 10, the fastening bores 17 continue through sleeve-like projections 18, which are inserted into the through-bores 20 as centering aids. The diameter of the through-bores 20 is adapted to the outer diameter of the projections 18 and the height of the projections is adapted to the thickness of the frame pieces 11 and 12 in the area of the through-bores 20, or designed to be slightly less than the thickness. The depth braces, which are screwed to the two frames 10 at all eight corners result in torsionally stiff corner connections which can be produced with simple parts and little assembly effort. The prefabricated frames can be stored and transported in a space-saving manner together with the rear wall and the cabinet door. The rack constructed in this way can therefore be stored and transported disassembled and can be quickly and easily assembled into a torsionally stiff unit at the place where it is to be used.

Bearing seats 19 with a bearing bore or a bearing screw thread can be formed on a portion of the cover plates 16 so that the installation of a cabinet door in the rack is made easier.

I claim:

1. In a rack for a control cabinet comprising twelve frame pieces connected to each other in the area of the rack corners,
   the improvement comprising:
   a plurality of front horizontal frame pieces (11) and a plurality of front vertical frame pieces (12) and a plurality of rear horizontal frame pieces and a plurality of rear vertical frame pieces miter-cut at their ends and each fixedly welded together at their ends forming a front and rear frame (10),
   a plurality of frame pieces (13) in the form of depth braces closed off on each end by a fastening plate (14), forming at least two fastening screw receptacles (15),
   the corner areas of each frame (10) forming correspondingly distributed through-bores (20), and
   in each corner area of the frame (10), a cover plate (16) fastened on the frame (10) by a plurality of fastening screws (24), said fastening screws (24) inserted into fastening bores (17) of the cover plate (16) and through said through-bores (20) of the frame (10) into said fastening screw receptacles (15) of the fastening plate (14) connected to the depth braces.

2. In a rack in accordance with claim 1,
   wherein
   said fastening plate (14) and the cover plate (16) are L-shaped and form three fastening screw receptacles (15) and fastening bores (17), respectively, disposed on the corners of a right triangle.

3. In a rack in accordance with claim 1,
   wherein
   said cover plate (16) comprises a plurality of sleeve-like projections (18) on the back of the cover plates (16) facing the frame (10) through which a plurality of fastening bores (17) are guided, and
   the diameters of the through-bores (20) in the frames (10) correspond to the outer diameter of the sleeve-like projections (18) of the cover plate (16).

4. In a rack in accordance with claim 1,
   wherein
   the height of said sleeve-like projections (18) of the cover plate (16) is less than or equal to the thickness of the frame pieces (11, 12) in the area of the throughbores (20).

5. In a rack in accordance with claim 1,
   wherein
   each of said frame pieces (11, 12) of the frame (10) comprises an L-shaped profiled leg (21) formed on the outside and forming a receiving groove (23) open toward the front or back of the rack, and
   said cover plate (16) is L-shaped and matched in the width of their legs to the width of the receiving groove (23).

6. In a rack in accordance with claim 1,
   wherein
   on a portion of the cover plate (16) on the front facing away from the frame (10), a bearing seat (19) with a bearing bore or a bearing screw thread is formed.

7. In a rack in accordance with claim 2.
   wherein
   said cover plate (16) comprises a plurality of sleeve-like projections (18) on the back of the cover plates (16) facing the frame (10) through which a plurality of fastening bores (17) are guided, and
   the diameters of the through-bores (20) in the frames (10) correspond to the outer diameter of the sleeve-like projections (18) of the cover plate (16).

8. In a rack in accordance with claim 7,
   wherein
   the height of said sleeve-like projections (18) of the cover plate (16) is less than or equal to the thickness of the frame pieces (11, 12) in the area of the through-bores (20).

9. In a rack in accordance with claim 8,
   wherein
   each of said frame pieces (11, 12) of the frame (10) comprises an L-shaped profiled leg (21) formed on the outside and forming a receiving groove (23) open toward the front or back of the rack, and
   said cover plate (16) is L-shaped and matched in the width of their legs to the width of the receiving groove (23).

10. In a rack in accordance with claim 9,
    wherein
    on a portion of the cover plate (16) on the front facing away from the frame (10), a bearing seat (19) with a bearing bore or a bearing screw thread is formed.

* * * * *